United States Patent [19]

Levit et al.

[11] Patent Number: 4,907,612

[45] Date of Patent: Mar. 13, 1990

[54] UNIVERSAL MATERIAL HANDLING APPARATUS

[75] Inventors: Boris Levit, Cupertino; Michael A. C. Millerick, San Jose, both of Calif.

[73] Assignee: National Semiconductor Corporation, Santa Clara, Calif.

[21] Appl. No.: 263,724

[22] Filed: Oct. 28, 1988

[51] Int. Cl.[4] .............................................. B08B 3/02
[52] U.S. Cl. ....................................... 134/72; 134/126; 134/127; 134/131; 198/384; 198/416; 198/803.14; 198/860.3
[58] Field of Search .................. 134/63, 72, 126, 127, 134/128, 129, 131; 198/384, 416, 803.14, 860.3, 644

[56] References Cited

U.S. PATENT DOCUMENTS

| | | | |
|---|---|---|---|
| 737,195 | 8/1903 | Barry et al. | 134/128 |
| 907,790 | 12/1908 | Hancock | 198/803.14 |
| 2,005,629 | 6/1935 | Marsden | 198/416 X |
| 2,166,428 | 7/1939 | DuBois | 134/72 X |
| 3,129,713 | 4/1964 | Read | 134/129 X |
| 3,160,262 | 12/1964 | Nolte | 198/803.14 X |
| 3,282,273 | 11/1966 | Johnston et al. | 134/129 X |
| 3,411,518 | 11/1968 | Fisher et al. | 134/72 |
| 4,165,756 | 8/1979 | Sirch et al. | 134/63 X |
| 4,281,675 | 8/1981 | Pure | 134/72 X |
| 4,508,611 | 4/1985 | Johnson et al. | 204/202 |
| 4,534,843 | 8/1985 | Johnson et al. | 204/202 |

Primary Examiner—Philip R. Coe

[57] ABSTRACT

A material handling apparatus, including a pair of drive chains (each configured as a continuous loop oriented in a substantially vertical plane), and one or more rigid members are attached between the chains. A product carrier is supported by each rigid member, and a product (which may include one or more integrated circuit leadframes) rests in each carrier. As the chains simultaneously rotate at the same rotational speed, they translate each member, carrier, and product along a carrier path in a substantially vertical plane. One or more nozzle arrays (each comprising one or more nozzles) are positioned along the carrier path, preferably above the drive chains. Barriers are preferably positioned between the drive chains and selected ones of the nozzles to prevent exposure of the drive chains to some or all of the jets from the nozzles (and especially to abrasive, corrosive, or otherwise harsh jets such as deflashing slurry jets). The carriers are preferably shaped and dimensioned so that products of various types, shapes, and sizes may be placed therein. The carriers are preferably perforated to allow drainage of the jet material. In one preferred embodiment, means are provided for flipping each product at one or more desired locations along the carrier path. For example, the flipping means may serve to expose a second face of the product to a second nozzle array at a second treatment station along the carrier path, after a first face of the product has been exposed to a first nozzle array at a first treatment station along the carrier path.

36 Claims, 2 Drawing Sheets

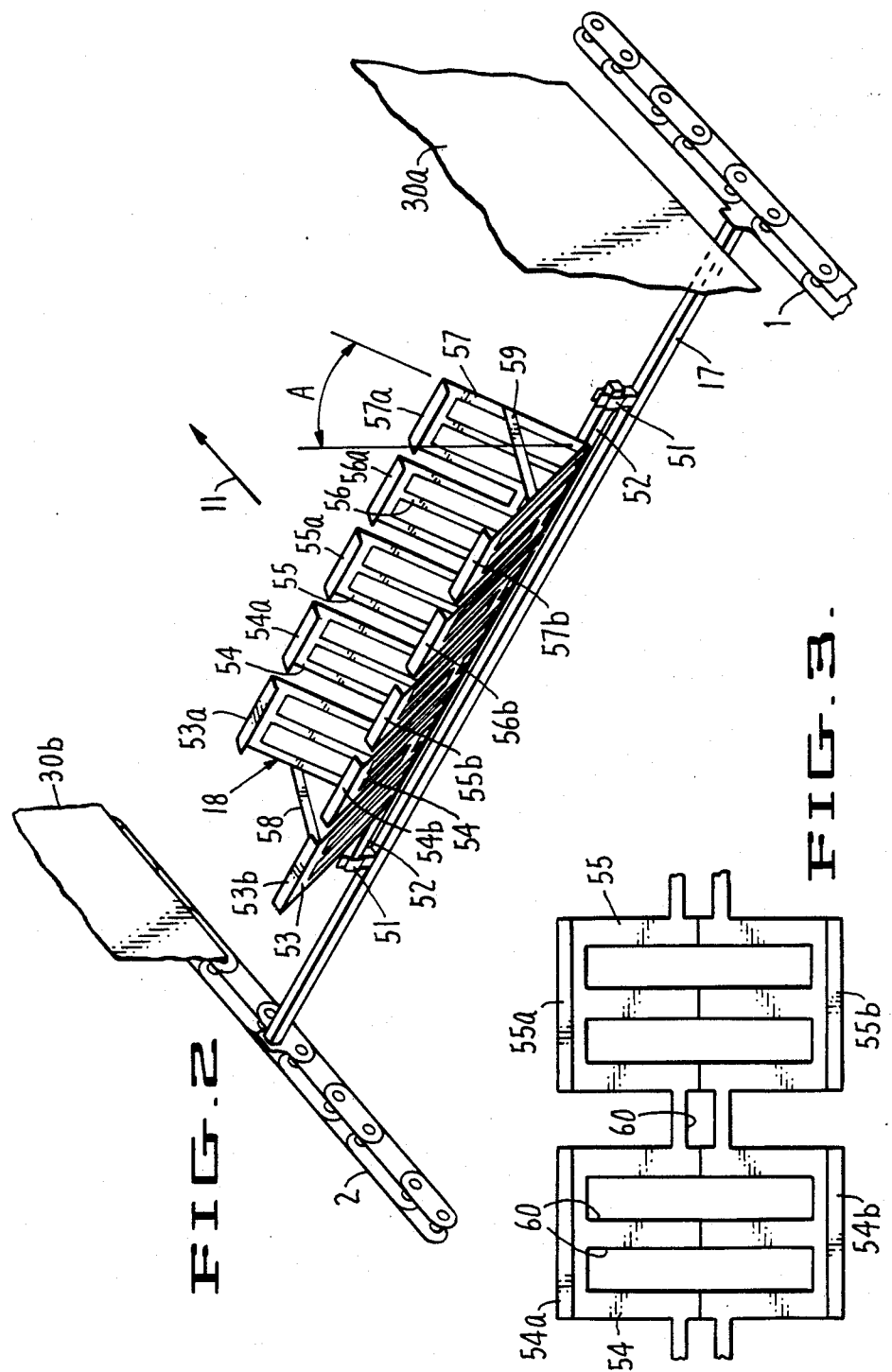

UNIVERSAL MATERIAL HANDLING APPARATUS

FIELD OF THE INVENTION

This invention relates to apparatus for transporting materials along a path for exposure to at least one jet from one or more nozzle arrays. More particularly, the invention relates to chain-driven apparatus for transporting materials along a path in a substantially vertical plane for successive treatment by a jet from a nozzle array at two or more treatment stations.

BACKGROUND OF THE INVENTION

Numerous conventional processes require that materials be successively exposed to jets from one or more nozzles or nozzle arrays. The jets may comprise solid particles, liquids, slurries, or gas (such as high-pressure air). An important example of this type of process occurs during the manufacture of electronic components, such as integrated circuit leadframes and similar components.

In the electronic component industry, discrete or integrated components are typically encapsulated in an electrically insulating material such as a plastic or ceramic package. Metal contacts or leads generally protrude from the package. These contacts or leads typically require deflashing or other chemical treatment before or after encapsulation.

It is conventional to accomplish such treatment by loading the parts onto racks or into baskets, and sequentially exposing the racks or baskets to jets from a number of nozzles or nozzle arrays, by translating the racks or baskets past the nozzles. The jets typically include a jet comprising a deflashing slurry, one or more rinsing jets (which may comprise water or a cleansing solution), and one or more drying jets (which may comprise air).

It is conventional to employ a conveyor (which may include a chain belt drive) to translate the racks past the nozzles. However, conventional conveyors may undesirably transfer substantial amounts of the deflashing slurry to subsequent processing stations, and may rapidly wear out due to exposure to the deflashing slurry. To avoid these problems, some conventional system have employed at least two isolated and distinct conveyors, rather than a single conveyor for translating each product being treated past all treatment stations. In this type of multi-conveyor system, the products undergoing treatment must be transferred from at least one conveyor (which may be exposed to a deflashing slurry) to at least one other conveyor (which is positioned so as not to be exposed to the slurry).

In general, conventional material handling systems embody all or some of the following disadvantages: complexity, in the sense that complex mechanical components (such as shafts, belts, isolation joints, and the like) are required to transfer the products being treated between distinct conveyors; complexity, in the sense that extremely accurate positioning mechanisms are required for loading and unloading the products onto and off each conveyor; limited conveyor lifetime due to exposure to corrosive, abrasive, or otherwise harsh jets from nozzles; inability to transport products having a wide range of shapes and sizes without system modifications; low production rate, because the products being treated are oriented with their longitudinal axis parallel to their travel path so that few products are processed per unit length of the product travel path; and unreliability, in the sense that a percentage of the products being transported, especially delicate products such as electronic components, are damaged during the loading and unloading processes or lost during transportation along the process path.

Until the present invention, it was not known how to transport materials for sequential exposure to jets from nozzles or nozzle arrays in a manner eliminating all the mentioned disadvantages.

SUMMARY OF THE INVENTION

The inventive material handling apparatus includes a pair of drive chains (each configured as a continuous loop oriented in a substantially vertical plane), and one or more rigid members attached between the drive chains. A product carrier is supported by each rigid member, and a product (such as an integrated circuit leadframe) is placed in each carrier. The carriers are preferably shaped and dimensioned so that products of various types, shapes, and sizes may be placed therein, and preferably are perforated to allow drainage of any jet material directed at the carriers from a nozzle array. Each rigid member is preferably a horizontal rod or bar. A power source rotates the drive chains so as to translate each member, carrier, and product along a path in a substantially vertical plane.

One or more nozzle arrays (each including one or more nozzles) are positioned along the carrier path, preferably above the drive chains. Barriers may be positioned between the drive chains and selected ones of the nozzles or nozzle arrays, to prevent exposure of the drive chains to some or all of the jets from the nozzles (especially abrasive, corrosive, or otherwise harsh jets such as deflashing slurries).

In one preferred embodiment, means are provided for flipping each part within its carrier at each desired location along the carrier path. For example, such means may be provided between first and second treatment stations along the carrier path, so that one face of the product may be exposed to a first nozzle array at the first treatment station and then another face of the product may later be exposed to a second nozzle array at the second treatment station.

BRIEF DESCRIPTION OF THE DRAWINGS

FIG. 2 is a perspective view of a portion of the apparatus of FIG. 1, showing in more detail a preferred embodiment of the product carrier of the inventive apparatus.

FIG. 3 is a top elevational view of a portion of the product carrier shown in FIG. 2.

DETAILED DESCRIPTION OF THE PREFERRED EMBODIMENTS

Figure 1:
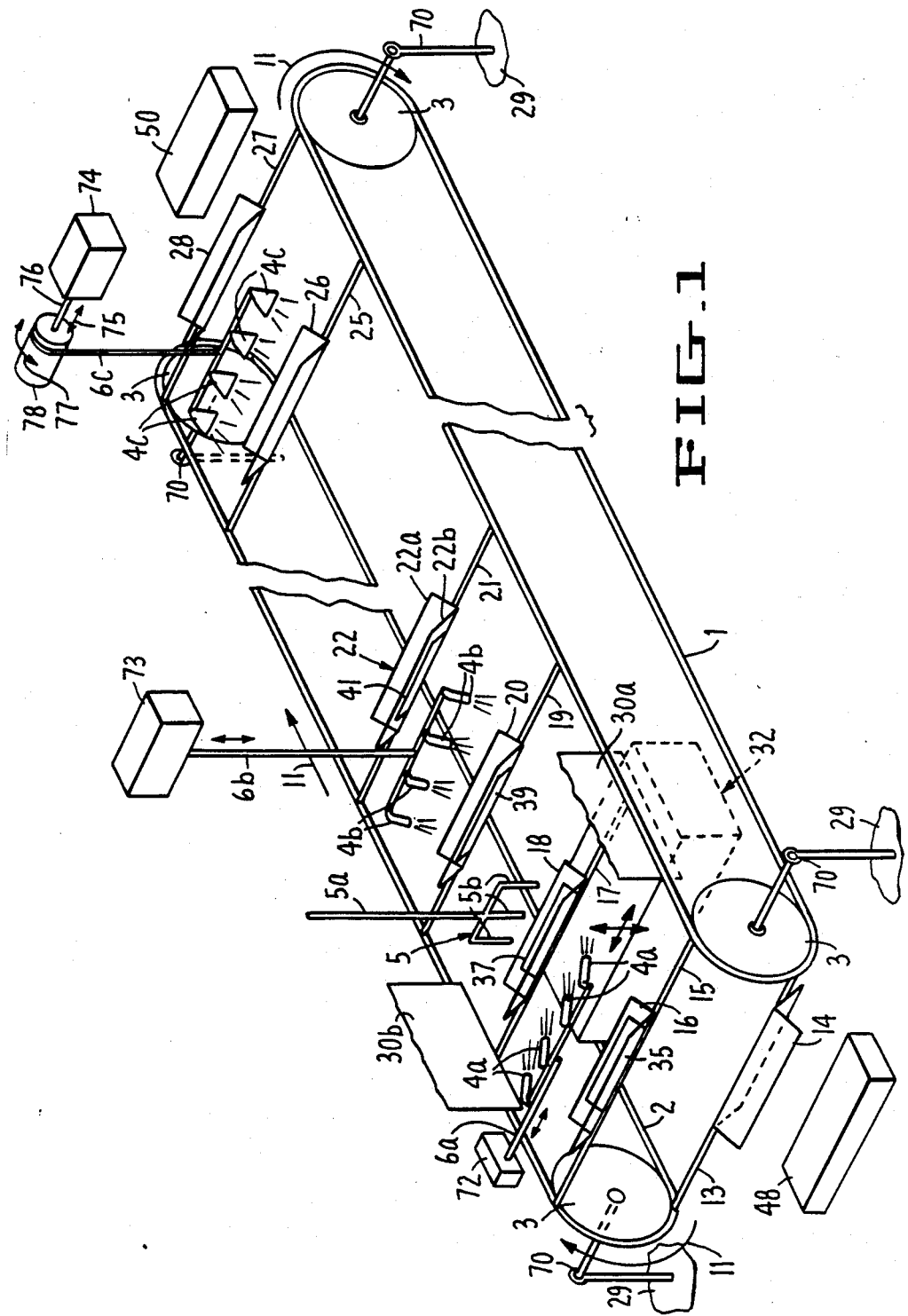
FIG. 1 is a simplified perspective view of a preferred embodiment of the inventive apparatus.

A preferred embodiment of the invention will be described with reference to FIG. 1. Drive chains 1 and 2 are oriented in substantially parallel planes. vertical plane. Each chain is driven in a substantially vertical path by drive sprockets 3, which may be powered by a conventional power source (not illustrated), and which are dimensioned to engage the links of chains 1 and 2. A number of rigid members, including members 13, 15, 17, 19, 21, 25, and 27 are attached between chains 1 and 2. Each rigid member shown in FIG. 1 supports one of product carriers 14, 16, 18, 20, 22, 26, and 28. Products 35, 37, 39, and 41, each of which may be an encapsulated electronic component, rest in carriers 16, 18, 20, and 22 respectively. Each untreated product is loaded onto one of the carriers at loading station 48, and each treated product may be unloaded from its carrier at unloading station 50.

The inventive system may include any number of product carriers, with the constraint that each product is supported by a rigid member extending between the drive chains. The term "part" will be used synonymously with the term "product" in this specification, including in the claims. It is specifically contemplated that each carrier of the inventive apparatus may carry a product load consisting of one product or more than one individual products.

As the drivers (drive sprockets 3) rotate chains 1 and 2 at the same rotational speed, rigid members 13, 15, 17, 19, 21, 25, and 27 and any products (such as products 35, 37, 39, and 41) supported in the associated carriers are translated clockwise (in the direction of arrows 11) along a path in a substantially vertical plane. Such path will sometimes be denoted herein as the "carrier path."

One or more nozzle arrays, such as arrays 4a, 4b, and 4c are positioned along the product path. In the preferred embodiment shown in FIG. 1, each nozzle array is supported above chains 1 and 2 by one of supports 6a, 6b, and 6c. Throughout this Specification, including in the claims, the phrase "nozzle array" denotes an array including one or more nozzles. Thus, although each of arrays 4a, 4b, and 4c is shown in FIG. 1 to include four nozzles, each might alternatively include one, two, three, or more than four nozzles.

Tanks such as tank 32 may be positioned below drive chains 1 and 2, to receive solid or liquid jet material draining from a nozzle array (such as array 4a), carrier (such as carrier 18), and product (such as product 37) disposed above the tank. Drive sprockets 3 are held above floor 29 by support means 70.

Preferably, walls or barriers (such as barriers 30a and 30b, each partially shown in FIG. 1) separate each harsh jet environment from drive chains 1 and 2. Thus, barrier 30a is positioned to prevent a jet of abrasive or corrosive deflashing slurry from array 4a from reaching chain 1, and barrier 30b is positioned to prevent a jet of abrasive or corrosive deflashing slurry from array 4a from reaching chain 2.

Member 5 hangs in the path of carriers 16, 18, 20, 22, and 26 from support member 5a. Each carrier is rigidly attached to the associated rigid member, so that each carrier has a "forward" side (such as side 22a of carrier 22) and a "backward" side (such as side 22b of carrier 22). A product resting on the carrier's forward (or "leading") side will present a first side upward, so at to be exposed to any jet flowing downward from a nozzle array above the carrier. If the same product is flipped so as to rest against the carrier's backward (or "trailing") side, it will present a second side (opposite to the first side) upward, so as to be exposed to any jet flowing downward from a nozzle array above the carrier. As each carrier translates past member 5, the teeth 5b of member 5 engage the product in the carrier and cause the product to rotate from the carrier's forward side to the carrier's backward side. For example, a first face of flat product 37 in carrier 18 is exposed to nozzle array 4a at a first treatment station upstream from member 5. As carrier 18 translates along the carrier path, member 5 will rotate (or "flip") product 37 so that after such flipping operation product 37 will rest against the trailing side of carrier 18 (in the same position relative to carrier 18 as product 39 has relative to carrier 20), so as to expose the opposite face of product 37 in carrier 18 to nozzle array 4b at a second treatment station along the carrier path.

Any number of identical flipping members 5 may be positioned along the carrier path, each at a location at which it is desirable to rotate the products undergoing treatment. Treatment stations may be provided along the carrier path for deflashing, rinsing, hot air drying, and the like, and it may be appropriate to rotate the products at each station or between adjacent pairs of stations.

In FIG. 1, nozzle arrays 4a, 4b, and 4c are supported above chains 1 and 2 by supports 6a, 6b, and 6c, respectively. Supports 6a, 6b, and 6c may hold nozzle arrays 4a, 4b, and 4c stationary.

However, in a preferred embodiment, the inventive system includes means for reciprocating the nozzles in each array relative to the products being treated, along both a horizontal axis and a vertical axis. Such reciprocating motion of the nozzles will minimize the required number of nozzles in each nozzle array. In a variation on this preferred embodiment, means are provided for reciprocating the nozzles in each array along either the horizontal axis or the vertical axis, but not both.

For example, drive means 72 is provided for reciprocating support 6a along a horizontal axis perpendicular to the carrier path, and drive means 73 is provided for reciprocating support 6b along a vertical axis perpenicular to the carrier path. One preferred mechanism for reciprocating supports 6a and 6b would employ conventional cam mechanisms. For another example, drive means 74, shaft 76, and spool 78 are provided for reciprocating support 6c along both a horizontal axis and a vertical axis perpendicular to the carrier path. Support 6c which suspends nozzle array 4c is composed of flexible material which may be wound onto and unwound from spool 78 as drive means 74 rotates shaft 76 clockwise or anticlockwise in the direction of arrows 77. Means 74 may rotate shaft 76 so as to reciprocate array 4c vertically relative to the products within the carriers translating past array 4c. Means 74 is also capable of retracting and extending shaft 76 along the shaft's longitudinal axis, to translate each nozzle in array 4c bi-directionally parallel to the longitudinal axis of member 25 and carrier 26. Alternatively, cam means may be provided for driving support 6c both vertically and horizontally.

The nozzles in each array are preferably arranged along a horizontal line perpendicular to the planes of chains 1 and 2, as shown in FIG. 1. The nozzles are preferably aimed perpendicular to the forward (or backward) side of the carriers. In the FIG. 2 embodiment (to be described in more detail below), the forward (and backward) side of each carrier is oriented at an angle A with respect to a vertical plane. The preferred average distance between each nozzle and the product being treated (the product will rest against the forward or backward side of a carrier) will typically be in the range from two inches to four inches. The preferred amplitude of the horizontal reciprocating motion of each nozzle will typically be two inches (i.e., each nozzle will be displaced by no more than about two inches from its average horizontal position). The absolute value of the preferred amplitude of each nozzle's vertical reciprocating motion is:

$h = [B \cos(A)]/2,$ where B is the width (perpendicular to the carrier's horizontal longitudinal axis) of the widest product to be treated.

The arrangement of the FIG. 1 embodiment reduces the area of floor 29 occupied by the inventive apparatus per part (i.e., per part undergoing treatment), by translating elongated parts with their longitudinal axes perpendicular to their travel path. In contrast, the FIG. 1 embodiment would occupy more floor space to accommodate the same number of product carriers, if product carriers were positioned end-to-end, with the carriers' longitudinal axes parallel to their direction of travel.

FIG. 2 is a more detailed view of a portion of the apparatus of FIG. 1. Carrier 18 includes rod portions 52, a central section (including portions 53, 54, 55, 56, and 57) attached between rod portions 52, and end pieces 58 and 59 attached to the ends of the central section. Rod portions 52 are removably attached to rigid member 17 by locks 51, so that carrier 18 may be removed from locks 51 when desired. Each lock 51 may be a spring lock, or any other lock allowing rapid attachment and removal of rod portions 52. The ends of member 17 are rigidly attached between chains 1 and 2, respectively, for example by welds.

Each of portions 53, 54, 55, 56, and 57 includes two lips for restraining motion of any part resting therein. Portion 53 includes lips 53a and 53b, portion 54 includes lips 54a and 54b, portion 55 includes lips 55a and 55b, portion 56 includes lips 56a and 56b, and portion 57 includes lips 57a and 57b. Chains 1 and 2 translate carrier 18 in the direction of arrow 11, so that lips 53a, 54a, 55a, 56a, and 57a comprise part of the carrier's forward edge, and lips 53b, 54b, 55b, 56b, and 57b comprise part of the carrier's backward edge.

Barriers 30a and 30b (each partially shown) shield chains 1 and 2, respectively, from jet material flowing directly from a nozzle above carrier 18, and any jet material recoiling from carrier 18 (or any product within carrier 18).

The central section of carrier 18 (including portions 53, 54, 55, 56, and 57) is preferably stamped from a flat sheet of metal and then bent into the shape shown in FIG. 2 (or a similar shape). End pieces 58 and 59 are then attached to the carrier's central portion for preventing products resting in carrier 18 from sliding past the carrier's ends. In this embodiment, carrier 18 may be easily and inexpensively manufactured.

FIG. 3 is a partial top elevational view of carrier 18 of FIG. 2. Portions 54 and 55 of carrier 18's central portion are perforated, and accordingly define windows 60. Solid or liquid particles comprising a jet directed at carrier 18 may fall (or drain) away from the carrier, and any part resting in the carrier, through windows 60.

Various modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus for handling a substantially planar first part, the first part having a first surface and a second surface opposite said first surface, including:
   (a) a first drive chain oriented in a first plane;
   (b) a second drive chain oriented in a second plane substantially parallel to the first plane;
   (c) a first rigid member, having a first end attached to the first drive chain and a second end attached to the second drive chain;
   (d) a first carrier attached to the first rigid member and dimensioned to receive the first part, the first carrier being V-shaped and having a leading side and a trailing side attached to a leading side so that when the first surface of the first part is contiguous with the leading side the trailing side acts as a stop against which the first part may be flipped thereby upwardly exposing the first surface of said first part, wherein the first drive chain and the second drive chain may be rotated simultaneously so as to translate the first rigid member, the first carrier, and the first part along a carrier path in a substantially vertical plane; and
   (e) a first nozzle array disposed at a first station along the carrier path, for directing at least one jet at the first carrier and the first part when the first part and the first carrier translate past the first station.

2. The apparatus of claim 1, also including:
   a first barrier positioned between the first nozzle array and the first drive chain to prevent exposure of the first drive chain to each jet emerging from the first nozzle array; and
   a second barrier positioned between the first nozzle array and the second drive chain to prevent exposure of the second drive chain to each jet emerging from the first nozzle array.

3. The apparatus of claim 1, also including:
   (f) means for reciprocating the first nozzle array in a vertical plane perpendicular to the plane of the carrier path.

4. The apparatus of claim 3, wherein the reciprocating means is also capable of reciprocating the first nozzle array in a horizontal plane perpendicular to the plane of the carrier path.

5. An apparatus for handling a first part wherein the first part has a first surface and a second surface opposite said first surface, including:
   (a) a first drive chain oriented in a first plane;
   (b) a second drive chain oriented in a second plane substantially parallel to the first plane;
   (c) a first rigid member, having a first end attached to the first drive chain and a second end attached to the second drive chain;
   (d) a first V-shaped carrier attached to the first rigid member, and having a leading side and a trailing side, wherein the first carrier is dimensioned to receive the first part with the first part resting on the leading side with the first side of the first part facing upward, wherein the first drive chain and the second drive chain may be rotated simultaneously so as to translate the first rigid member, the first carrier, and the first part along a carrier path in a substantially vertical plane;
   (e) a first nozzle array disposed at a first station above the carrier path, for directing at least one jet downward at the first carrier and the first part when the first part and the first carrier translate past the first station; and
   (f) a flipping member suspended along the carrier path in a position so that as the first carrier translates past the flipping member, the flipping member engages the first part and causes the first part to rotate into a backward rotational position in which the first part rests on the first carrier's trailing side, and the second side of the first part faces upward.

6. The apparatus of claim 5, also including:
(g) a second nozzle array disposed at a second station along the carrier path, for directing at least one jet at the first carrier and the first part when the first part and the first carrier translate past the second station, wherein the flipping member is positioned along the carrier path between the first station and the second station.

7. The apparatus of claim 1, also including:
(i) a second nozzle array disposed at a second station along the carrier path, for directing at least one jet at the first carrier and the first part when the first part and the first carrier translate past the second station.

8. The apparatus of claim 1, wherein the first carrier is perforated to allow drainage of material comprising the at least one jet from the first carrier and the first part.

9. An apparatus for handling a first part, including:
(a) a first drive chain oriented in a first plane;
(b) a second drive chain oriented in a second plane substantially parallel to the first plane;
(c) a first rigid member, having a first end attached to the first drive chain and a second end attached to the second drive chain;
(d) a V-shaped first carrier attached to the first rigid member and dimensioned to receive the first part, wherein the first carrier includes a set of leading side members and a set of trailing side members and each of the leading side members and trailing side members includes a lip dimensioned to restrain motion of the first part within the first carrier, wherein the first drive chain and the second drive chain may be rotated simultaneously so as to translate the first rigid member, the first carrier, and the first part along a carrier path in a substantially vertical plane; and
(e) a first nozzle array disposed at a first station along the carrier path, for directing at least one jet at the first carrier and the first part when the first part and the first carrier translate past the first station.

10. The apparatus of claim 1, also including:
(j) a second rigid member having a first end attached to the first drive chain and a second end attached to the second drive chain; and
(k) a second carrier attached to the second rigid member and dimensioned to receive a second part, wherein simultaneous rotation of the first drive chain and the second drive chain will translate the second rigid member, the second carrier, and the second part along the carrier path.

11. The apparatus of claim 10, wherein the first carrier and the second carrier are perforated to allow drainage of material comprising the at least one jet therefrom.

12. The apparatus of claim 1, wherein at least one jet includes a deflashing slurry.

13. A material handling apparatus including:
(a) a pair of substantially vertically oriented drive chains;
(b) a first bar attached between the drive chains in a manner so that the chains translate the first bar along a path in a substantially vertical plane as the chains rotate;
(c) a V-shaped first carrier having a leading side attached to a trailing side, said carrier being attached to the first bar and dimensioned to support a substantially planar product load having a first face and a second face, wherein the leading side and the trailing side are oriented so that when the first face of said product load is contiguous with the leading side, the trailing side is available as a stop against which said product load may be flipped and, wherein the product load is translated by the first bar and the first carrier along a carrier path in a substantially vertical plane as the chains rotate; and
(d) a first array of at least two nozzles disposed at a first station along the carrier path, wherein the nozzles in the first array are spaced from each other perpendicularly to the carrier path, and wherein each nozzle in the first array directs a jet at the first carrier and the product load when the product load and the first carrier translate past the first station.

14. A material handling apparatus including:
(a) a pair of substantially vertically oriented drive chains;
(b) a first bar attached between the drive chains in a manner so that the chains translate the first bar along a path in a substantially vertical plane as the chains rotate;
(c) a V-shaped first carrier attached to the first bar and dimensioned to support a product load, wherein the first carrier has a leading side and a trailing side, wherein each of the leading side and the trailing side has a surface oriented so that the product load may rest against said surface, so that the product load is translated by the first bar and the first carrier along a carrier path in a substantially vertical plane as the chains rotate; and
(d) a first array of at least two nozzles disposed at a first station along the carrier path, wherein the nozzles in the first array are spaced from each other perpendicularly to the carrier path, wherein each nozzle in the first array directs a jet at the first carrier and the product load when the product load and the first carrier translate past the first station and wherein each nozzle in the first array is aimed substantially perpendicularly to the leading side's surface.

15. The apparatus of claim 13, also including:
(e) a tank disposed below the carrier path at the first station, and dimensioned to receive jet material flowing directly from the first nozzle array and jet material draining from the product load and the first carrier.

16. The apparatus of claim 15, also including a first barrier positioned between the first nozzle array and the first drive chain to prevent exposure of the first drive chain to each jet emerging from the first nozzle array.

17. The apparatus of claim 16, also including a second barrier positioned between the first nozzle array and the second drive chain to prevent exposure of the second drive chain to each jet emerging from the first nozzle array.

18. The apparatus of claim 16, also including:
(f) means for reciprocating the first nozzle array in a plane perpendicular to the plane of the carrier path.

19. The apparatus of claim 18, wherein element (f) is capable of reciprocating the first nozzle array along both a horizontal axis and a vertical axis in said plane perpendicular to the plane of the carrier path.

20. The apparatus of claim 13, wherein the first carrier is dimensioned to contain at least one encapsulated integrated circuit.

21. The apparatus of claim 13, also including:
means for removably attaching the first carrier to the first bar.

22. The apparatus of claim 21, wherein the means for removably attaching the first carrier to the first bar includes a quick release lock.

23. The apparatus of claim 13, wherein each said jet includes a deflashing slurry.

24. A material handling apparatus, including:
(a) a pair of substantially vertically oriented drive chains;
(b) a bar attached substantially horizontally between the drive chains in a manner so that the chains translate the bar along a path as the chains simultaneously rotate;
(c) a V-shaped carrier having first and second sides, attached to the bar and dimensioned to support an electronic component having a face, wherein the first side and the second side are oriented so that when the face of the electronic component is contiguous with the first side, the second side is available as a stop against which the electronic component may be flipped, wherein the component is translated by the carrier and the bar along a carrier path in a substantially vertical plane as each chain rotates in a substantially vertical plane;
(d) a first array including one or more nozzles, disposed at a first station along the carrier path, wherein each nozzle in the first array directs a jet at the carrier and the component when the component and the carrier translate past the first station; and
(e) a second array including one or more nozzles, disposed at a second station along the carrier path, wherein each nozzle in the second array directs a jet at the carrier and the component when the component and the carrier translate past the second station.

25. The apparatus of claim 24, also including:
means for removably attaching the carrier to the bar.

26. The apparatus of claim 25, wherein the means for removably attaching the carrier to the bar includes a quick release lock.

27. The apparatus of claim 24, also including:
(f) means for reciprocating the first nozzle array along a nozzle path in a plane perpendicular to the plane of the carrier path.

28. A material handling apparatus, including:
(a) a pair of substantially vertically oriented drive chains;
(b) a bar attached substantially horizontally between the drive chains in a manner so that the chains translate the bar along a path as the chains simultaneously rotate;
(c) a V-shaped carrier attached to the bar and dimensioned to support an electronic component within the carrier, wherein the carrier includes a set of leading side members and a set of trailing side members, and each of the leading side members and trailing side members includes a lip dimensioned to restrain motion of the component within the carrier, wherein the component is translated by the carrier and the bar along a carrier path in a substantially vertical plane as each chain rotates in a substantially vertical plane;
(d) a first array including one or more nozzles, disposed at a first station along the carrier path, wherein each nozzle in the first array directs a jet at the carrier and the component when the component and the carrier translate past the first station; and
(e) a second array including one or more nozzles, disposed at a second station along the carrier path, wherein each nozzle in the second array directs a jet at the carrier and the component when the component and the carrier translate past the second station.

29. A material handling apparatus, including:
(a) a pair of substantially vertically oriented drive chains;
(b) a bar attached substantially horizontally between the drive chains in a manner so that the chains translate the bar along a path as the chains simultaneously rotate;
(c) a V-shaped carrier attached to the bar and dimensioned to support an electronic component within the carrier, wherein the component is translated by the carrier and the bar along a carrier path in a substantially vertical plane as each chain rotates in a substantially vertical plane;
(d) a first array including one or more nozzles, disposed at a first station along the carrier path, wherein each nozzle in the first array directs a jet at the carrier and the component when the component and the carrier translate past the first station;
(e) a second array including one or more nozzles, disposed at a second station along the carrier path, wherein each nozzle in the second array directs a jet at the carrier and the component when the component and the carrier translate past the second station;
(f) wherein the component has a first surface and a second surface opposite said first surface, the carrier has a leading side and a trailing side, wherein the leading side is oriented so that when the component rests on the carrier's leading side the component's first surface faces upward, and wherein each nozzle in the first array is mounted above the carrier path and directs a jet downward toward the carrier path, and also including:
(g) a flipping member suspended along the carrier path in a position so that as the carrier translates past the flipping member, the flipping member engages the component and causes the component to rotate into a backward rotational position in which the component rests on the carrier's trailing side, and the component's second surface faces upward.

30. The apparatus of claim 29, wherein the flipping member is positioned along the carrier path between the first station and the second station.

31. The apparatus of claim 24, wherein each jet includes a deflashing slurry.

32. The apparatus of claim 24, wherein the carrier is perforated to allow drainage of material comprising each jet from the carrier and from the component therein.

33. A material handling apparatus, including:
(a) a pair of substantially vertically oriented drive chains;
(b) a bar attached substantially horizontally between the drive chains in a manner so that the chains translate the bar along a path as the chains simultaneously rotate;

(c) a V-shaped carrier attached to the bar and dimensioned to support an electronic component within the carrier, wherein the component is translated by the carrier and the bar along a carrier path in a substantially vertical plane as each chain rotates in a substantially vertical plane, and wherein the carrier has a horizontal longitudinal axis, a flat leading side and a flat trailing side attached to the flat leading side, and wherein the flat leading side's plane is oriented at an angle A, with respect to a vertical plane;

(d) a first array including one or more nozzles, disposed at a first station along the carrier path, wherein each nozzle in the first array directs a jet at the carrier and the component when the component and the carrier translate past the first station; and (e) a second array including one or more nozzles, disposed at a second station along the carrier path, wherein each nozzle in the second array directs a jet at the carrier and the component when the component and the carrier translate past the second station; and (f) means for reciprocating each nozzle in the first nozzle array substantially vertically, so that the absolute value of the amplitude of each nozzle's vertical reciprocating motion is substantially equal to $h=[B \cos(A)]/2$, where B is the width of the component in a direction perpendicular to the horizontal longitudinal axis of the carrier.

34. An apparatus for carrying a substantially planar part having a face, comprising:
(a) a bar;
(b) driving means for translating the bar along a carrier path in a plane;
(c) a V-shaped carrier having a leading side and a trailing side, attached along the bar and dimensioned to receive said part so that when the face of said part is contiguous with the leading side, the trailing side is oriented to act as a stop against which said part may be flipped thereby upwardly exposing the face of said part.

35. An apparatus as claimed in claim 34 further comprising:
(d) means for spraying material on the part while said part is carried along the carrier path.

36. An apparatus as claimed in claim 34 further comprising:
(e) a flipping member suspended along the carrier path in a position so that as the carrier translates past the flipping member, the flipping member engages the part causing said part to flip.

* * * * *